US006940284B2

(12) United States Patent
McQueeney et al.

(10) Patent No.: US 6,940,284 B2
(45) Date of Patent: Sep. 6, 2005

(54) EFFICIENT DIAGNOSIS OF FAULTY DISTRIBUTORLESS AND HYBRID IGNITION SYSTEMS

(75) Inventors: Kenneth A. McQueeney, Los Gatos, CA (US); David B. Weiland, Union City, CA (US); David G. Capitolo, Fremont, CA (US)

(73) Assignee: Snap-On Incorporated, Pleasant Prairie, WI (US)

( * ) Notice: Subject to any disclaimer, the term of this patent is extended or adjusted under 35 U.S.C. 154(b) by 69 days.

(21) Appl. No.: 10/670,395

(22) Filed: Sep. 26, 2003

(65) Prior Publication Data

US 2005/0068037 A1 Mar. 31, 2005

(51) Int. Cl.[7] .......................... F02P 17/00; G01M 15/00
(52) U.S. Cl. ........................................ 324/380; 73/116
(58) Field of Search ................................ 324/72.5, 457, 324/548, 378–402, 169; 701/1, 114, 101–104, 29, 110, 111; 123/621, 630, 605, 650, 406.57, 634, 635, 636, 638; 73/116, 117.1, 117, 117.2, 117.3, 117.4, 118.1, 119 R

(56) References Cited

U.S. PATENT DOCUMENTS

| 4,306,187 A | * | 12/1981 | Kinder ........................ 324/395 |
| 4,445,477 A | * | 5/1984 | Ikeura .................... 123/406.53 |
| 4,602,507 A | * | 7/1986 | Hayes ........................ 73/117.3 |
| 5,034,893 A | | 7/1991 | Fisher |
| 5,237,278 A | | 8/1993 | Bumen |
| 5,258,753 A | * | 11/1993 | Jonker et al. ............. 345/440.2 |
| 5,359,518 A | * | 10/1994 | Wimmer ..................... 701/101 |
| 5,493,496 A | * | 2/1996 | James et al. ................. 701/102 |
| 5,574,217 A | * | 11/1996 | McCombie ................... 73/116 |
| 5,617,032 A | * | 4/1997 | Inagaki ........................ 324/399 |
| 5,719,330 A | * | 2/1998 | Carr et al. ................. 73/118.1 |
| 5,841,283 A | | 11/1998 | Bloemen |
| 6,067,489 A | * | 5/2000 | Letang et al. .................. 701/36 |
| 6,615,160 B1 | * | 9/2003 | Quinnett et al. ............ 702/185 |
| 6,848,296 B2 | * | 2/2005 | Tanaya ....................... 73/35.08 |
| 6,851,302 B2 | * | 2/2005 | Hashiguchi ................ 73/117.3 |
| 6,885,932 B2 | * | 4/2005 | Liu et al. ..................... 701/103 |
| 6,889,133 B2 | * | 5/2005 | Daniel et al. ............... 701/114 |
| 2003/0052687 A1 | | 3/2003 | McQueeney et al. |
| 2005/0056086 A1 | * | 3/2005 | Lee et al. ..................... 73/116 |

OTHER PUBLICATIONS

"kV Module Reference Manual", First Edition, Dec. 1999 Snap–On Diagnostics.
"Vantage Reference Manual", Fifth Edition, 2002, Snap–On Technologies, Inc.
"MT2700 DiS/kV Probe User's Guide", First Edition, Oct. 1991, Balco, Inc., a Snap–On Company.

* cited by examiner

*Primary Examiner*—Anjan Deb
*Assistant Examiner*—Hoai-An D. Nguyen
(74) *Attorney, Agent, or Firm*—McDermott Will & Emery LLP

(57) ABSTRACT

A method for efficiently determining whether a distributorless or hybrid ignition system is the origin of engine problems by consecutively disconnecting and reconnecting the primary connector from each coil of the ignition system. Once a single primary connector is disconnected from a coil and engine misfiring or roughness declines, the problem cylinder pair has been located. The method further includes measuring the firing line voltage of accessible spark plug wires for each cylinder to identify a single faulty cylinder, that may now be serviced.

8 Claims, 5 Drawing Sheets

EFFICIENT DIAGNOSIS OF FAULTY DISTRIBUTORLESS AND HYBRID IGNITION SYSTEMS

FIELD OF THE DISCLOSURE

The present disclosure relates to ignition systems, and more particularly to efficiently identifying faulty DIS or hybrid ignition systems.

BACKGROUND OF THE DISCLOSURE

Ignition systems are used in automobiles' internal combustion engines to initiate a chemical reaction between fuel and air in the cylinder charge by producing a spark. The spark ignites the compressed air and fuel, thus resulting in downward movement of the piston contained within the cylinder.

Modem automotive ignition systems typically include an ignition coil and a coil current switching device. The ignition coil and coil current switching device respond to an input or "drive" signal to charge the ignition coil. The ignition coil thereafter relays high voltage to the spark plugs, allowing the spark to ignite the air and fuel in the cylinder that corresponds to the spark plug.

Various types of modem ignition systems exist. Two of such systems are hybrid and distributorless ignition systems. A hybrid ignition system may include a coil-over-plug assembly where the coil provides an output for the spark plug under the coil and also for the spark plug wire to the companion cylinder.

In the past, distributors were common components of ignition systems. A distributor is a rotary switch that directs the high voltage ignition current in a proper firing sequence to the various cylinders of an internal combustion engine. However, many modem ignition systems operate without a distributor. These systems are known as distributorless ignition systems (DIS). A common distributorless ignition system includes a single coil with two outputs for the connection of spark plugs to opposing cylinder spark plugs.

As is well known, an automobile's engine has several components which can malfunction or fail to operate. When engine problems occur, the automobile is often presented to a technician who must first identify the origin of the problem and then proceed to repair. It is desirable that such identification and repair be performed quickly and at a reasonable cost. From the various possible sources of engine problems, the technician is faced with narrowing down the origin of the problem prior to repair. The source might be the system for any one of smog reduction, driveability, induction, cooling, lubrication, sensors and ignition.

Using conventional diagnostic systems, diagnosing whether an ignition system is the source of engine problems can be complex and time-consuming. Although there are many ways to ascertain whether an ignition system is the source of engine problems, engine analyzers are one such method of making this determination. DIS and hybrid ignition systems are particularly difficult to analyze due to the single ignition coil being connected to two separate cylinders. A typical scenario for ignition system analysis for a four-cylinder vehicle begins with moving a 2-½ feet wide, 2 feet deep and 5 feet tall engine analyzer to the vehicle for usage. A number of cables must then be sorted through to find four connecting cables and four push-on KV clips (two push-on clips for a hybrid ignition system due to one inaccessible plug wire). The firing order of the cylinders as well as the cylinder numbering scheme must also be determined. The switched side of the coil must be located, and push on clips are installed per the firing order with cylinder one first. Coil polarity may also need to be determined.

The analysis process continues when the engine is started and run at normal idle. With some analyzers, when the analyzer scope is properly set, the firing order is displayed. Because there are two firing lines, one for the power stroke, and one for the waste stroke, one should be read for each cylinder. Leads must be moved for each coil. In this process, a faulty cylinder in an ignition system is generally identified by the technician from the analyzer's visual display as the power firing line that is different from the others. It is only at this point that the technician proceeds to repair. This method involves a number of steps, which results in complexity and consumption of time. Because an engine analyzer is required for this process, the process becomes more expensive.

There is a need for a vehicle diagnostic method and system that provide a simpler, more efficient way to determine whether an ignition system is the source of engine problems.

There is a need for a vehicle diagnostic method and system that provide a cost-efficient way to determine whether an ignition system is the source of engine problems.

SUMMARY OF THE DISCLOSURE

The present disclosure addresses the needs noted above by providing an efficient and simple procedure for diagnosing ignition problems. The embodiments described herein are particularly suited for ignition systems of the distributorless or hybrid type that are used with four, six, eight, ten, twelve and sixteen cylinder engines.

According to one aspect of the present disclosure, a method is provided for quick diagnosis of ignition system problems. Engine problems originating with the ignition system are often characterized by misfiring and roughness. Misfiring occurs when the chemical reaction between fuel and air, initiated by the spark plug, does not result in a complete combustion of fuel, or a spark necessary to initiate combustion is missing. Roughness generally occurs when the engine moves or shakes. Because misfiring or roughness is associated with common faults of a distributorless or hybrid ignition system, the method and system disclosed herein takes advantage of these symptoms—or the lack thereof—to identify a faulty cylinder.

The method described herein includes consecutively disconnecting and reconnecting the primary connector from each coil of a distributorless or hybrid ignition system, one coil at a time. Each coil of these types of ignition systems generally connects a cylinder pair. The total number of coils in both hybrid ignition systems and DIS ignition systems depends on the number of engine cylinders. Automobile engines are commonly available with four, six, eight, twelve and sixteen cylinders. Therefore, for a six-cylinder engine, three coils are used. For an eight-cylinder engine, four coils are used. These disconnection and reconnection actions can be performed manually by the operator.

If the vehicle is not at fast idle speed upon disconnection of a primary connector, the idle speed of the vehicle should be increased. This might be accomplished through insertion of a shim or other device into the throttle linkage to obtain an idle speed of about 1500 rpm. Although increasing the speed to fast idle is not essential, it is helpful because a decline in misfiring or roughness may be more readily detected for most vehicles at fast idle. It should be noted that some vehicles already have an operating idle speed of about 1500 rpm, which may include situations where the automobile has problems such as a throttle sticking or a vacuum leak. Moreover, engine controls in some vehicles are designed to restore idle speed in certain situations, e.g., when a primary connector is disconnected. If the engine controls automatically restore idle speed to fast idle, no tools would be needed, although this shim tool could be an item such as a fingernail file.

When misfiring or roughness declines, and the decline may be in any perceptible manner, following disconnection of a primary connector, the problem cylinder pair has been identified. The decline of misfiring or roughness may be determined manually by the technician, such as by listening to, or touching the vehicle or through vibration sensors which sense the lack of unacceptable vibration for a vehicle.

Once the problem cylinder pair has been located—as evidenced by the decline of misfiring and roughness—the technician would then need to narrow the fault to a particular cylinder so that the repair process can begin. The technician does so by measuring the firing line voltage on each accessible spark plug wire. Abnormalities in this voltage assist in identifying the faulty cylinder. One example of a suitable device for measuring firing line voltage in accordance with the present disclosure is a SNAP ON VANTAGE MT2400 equipped with a KV module, KV clip and RPM clamp. Another example of such a device is a SNAP ON DIS TESTER MT2700.

For distributorless ignition systems, two spark plug wires are generally accessible. Therefore, the firing line voltage on both spark plug wires should be measured. The measurements may be taken with either of the firing line voltage measurement devices described above. The spark plug wire with abnormal voltage (higher or lower) is at fault.

For hybrid ignition systems, only one spark plug wire is generally accessible. The firing line voltage may be measured from this single accessible spark plug wire. If the voltage on the single accessible spark plug wire is normal, the faulty cylinder is the coil over plug cylinder. If the firing line voltage is abnormal on the single accessible spark plug wire, the fault is with the companion cylinder.

Generally, the firing line voltage, averaged statistically, for today's cylinders is around 8 kV to 9 kV. On older vehicles, the firing line voltage might be 6 kV to 9 kV. Ignition system problems are often characterized by sharp voltage peaks, e.g., around 35 kV or sharp voltage drops, e.g., around 2 kV to 3 kV for the firing line. Most often, a drop to 4 kV or a rise to 16 or 18 kV would be indicative of an abnormal firing line voltage. Generally, a normal firing line voltage will range from 7 kV to 12 kV depending on the spark plug gap.

As the present disclosure illustrates, ignition system problems can potentially be identified using only a tool that measures the firing line voltage.

One advantage of the present disclosure is to provide a time-efficient and simple method for diagnosing whether an engine problem is caused by a distributorless or hybrid ignition system. Minimal set-up time is needed to diagnose whether the ignition system is the source of the engine problem. Accordingly, ignition-based problems can be quickly isolated and repair can be instituted earlier.

Another advantage of the present disclosure is to provide a cost-efficient method for diagnosing ignition system problems. The method may be performed with the only required equipment being a device that measures firing line voltage. These devices are relatively inexpensive when compared to conventional diagnostic systems.

BRIEF DESCRIPTION OF THE DRAWINGS

These and other objects, features, and characteristics of the present disclosure will become apparent to one skilled in the art from a close study of the following detailed description in conjunction with the accompanying drawings and appended claims, all of which form a part of this application. In the drawings:

DETAILED DESCRIPTION OF THE DISCLOSURE

Engine problems can originate from any one of a number of systems that comprise the engine. Accordingly, the purpose of the disclosure described herein is to efficiently determine whether the distributorless or hybrid ignition system is the source of engine problems, and to do so with a reasonable degree of certainty.

The present disclosure is described with reference to hybrid and distributorless ignition systems, which generally fall into the category of waste spark ignition systems. Waste spark ignition systems generally include dual ended coils. One coil is generally connected to two cylinders, and the total number of coils depends on the total number of cylinders. For example, two coils are used in a four-cylinder engine, three coils for a six-cylinder engine, four coils for an eight-cylinder engine, and so on. The vast majority of vehicle engines have an even number of cylinders with a total of four to sixteen cylinders. The present disclosure is particularly suited for diagnosis of waste spark ignition systems for four-, six-, eight-, ten-, twelve or sixteen-cylinder engines. Each cylinder generally has its own spark plug.

The embodiments herein will be particularly described with respect to four- and eight-cylinder engines. Although the embodiments described herein make particular reference to automobile engines, it should be understood that the engines may be incorporated into other vehicle systems, such as trucks, boats, ships, motorcycles, generators, airplanes and other vehicles having at least four cylinders.

Common faults associated with distributorless and hybrid ignition systems can result in periodic or intermittent misfiring, which results in roughness when a vehicle is at normal idle. Misfiring occurs when the chemical reaction between fuel and air, initiated by the spark plug associated with a cylinder, does not result in a cylinder being properly compressed, exhausted or ignited. For many four-cylinder and eight-cylinder vehicles, normal idle occurs when the engine is at approximately 1500 rpm in neutral. As will be shown in greater detail hereinbelow, the roughness and misfiring associated with common faults for distributorless and hybrid ignition systems makes the method particularly suitable for these types of ignition systems.

Figure 1A:
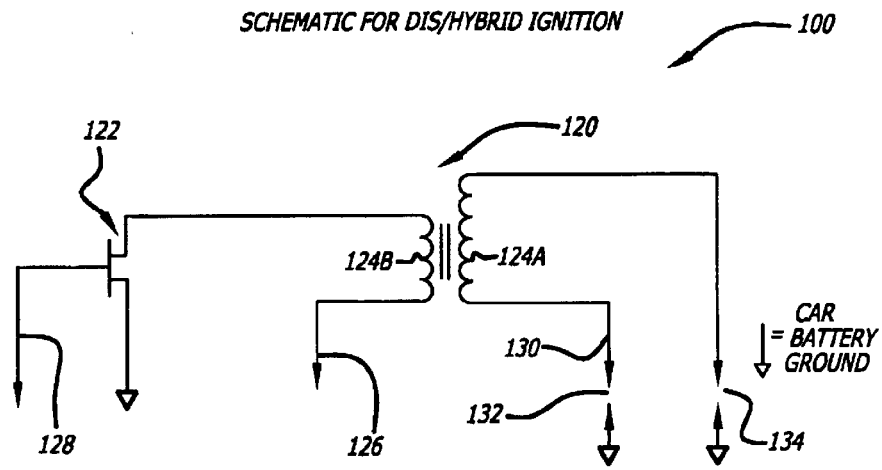
FIG. 1A is an electrical schematic for a typical distributorless or hybrid ignition system that can be diagnosed in accordance with the present disclosure.

Referring now to FIG. 1A, illustrated is an electrical schematic for a typical distributorless or hybrid ignition system that can be diagnosed in accordance with the present disclosure. Ignition system 100 includes an ignition coil 120 with a primary winding 124*b* and secondary winding 124*a*, coil output 130, power element 122 (in this case, a field effect transistor), spark plug gaps 132, 134, battery connection 126 and engine computer connection 128.

On late model vehicles, the drive signal that charges an ignition coil generally originates at the engine computer and may control the ignition module on the coil directly. The ignition system 100 is generally controlled by the engine's computer. The engine's computer communicates with the ignition system via engine computer connection 128. Through this engine computer connection 128, the engine computer controls the low voltage primary winding 124*b* through coil 120 which induces a high voltage in the secondary winding 124*a* which is then directed to both spark plugs at the appropriate time. The high voltage is induced when the primary winding 124*b* allows voltage from the battery via battery connection 126 to pass through the coil 120 where the voltage is stepped up to a much higher voltage than the battery voltage. The battery voltage is generally in the range of 12–14 volts, and the disconnect transient, about 400–500 volts peak, and may be stepped up to tens of thousands of volts. Forty thousand volts is not uncommon. Although this embodiment described herein includes a battery, it should be understood that these embodiments may also include or be used with any appropriate voltage source, e.g., an alternator and the like, providing any appropriate voltage, e.g., about 12 volts, 42 volts and the like.

In the case of a hybrid ignition system as represented by FIG. 1A, coil 120 provides an output 130 for connection of the spark plug wire of the coil-over-plug assembly (not shown) at spark plug gap 132. The spark plug wire for the opposing cylinder (not shown) connects to coil 120 at spark plug gap 134.

In the case of a distributorless ignition system as represented by FIG. 1A, coil 120 has two outputs at gaps 132, 134 for the connection of spark plug wires (not shown) to opposing cylinder spark plugs.

The opposing cylinders of a hybrid ignition system are often referred to as "event" and "companion" cylinders. The event cylinder is that which fires near top dead center (i.e., when the piston is at its highest point in the cylinder) on the compression stroke. The companion is the cylinder that fires near top dead center on the exhaust stroke. These cylinders alternate every other crankshaft revolution. During normal operation, when an event cylinder attached to the first spark plug via gap 132 compresses, the companion cylinder attached to the first spark plug via gap 134 exhausts. Conversely, when the companion cylinder compresses, the event cylinder exhausts.

Figure 1B:
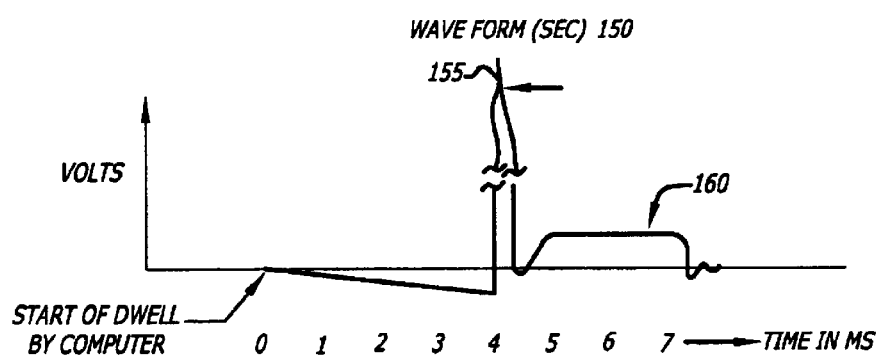
FIG. 1B is a waveform as a typical distributorless or hybrid ignition system fires a spark plug.
Figure 1B:
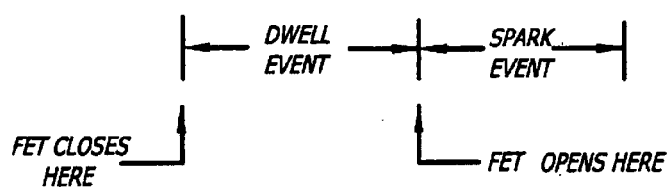

An important characteristic of waste spark systems is that the spark on the exhaust stroke requires very little voltage to fire a spark plug. Referring now to FIG. 1B, illustrated is a graphical representation of the waveform 150 as a typical distributorless or hybrid ignition system fires a spark plug. This waveform 150 represents the signal associated with the event cylinder when the event cylinder is the compression stroke cylinder. When the engine computer begins a dwell operation, the power element 122 closes, resulting in a drop in the voltage of the ignition coil 120 over the course of a few milliseconds. A spark event is initiated by the engine computer via engine computer connection 128. At the beginning of a spark event, the field effect transistor 122 opens. The voltage spikes for a very brief period of time, drops considerably, and then experiences a slight, steady increase for the duration of the spark event.

The voltage spike is the firing line voltage 155 as shown in FIG. 1B. The spark line 160 is the voltage at the top of the spark plug during burn time, which is the length of time that an arc occurs across the spark plug gap.

Figure 2:
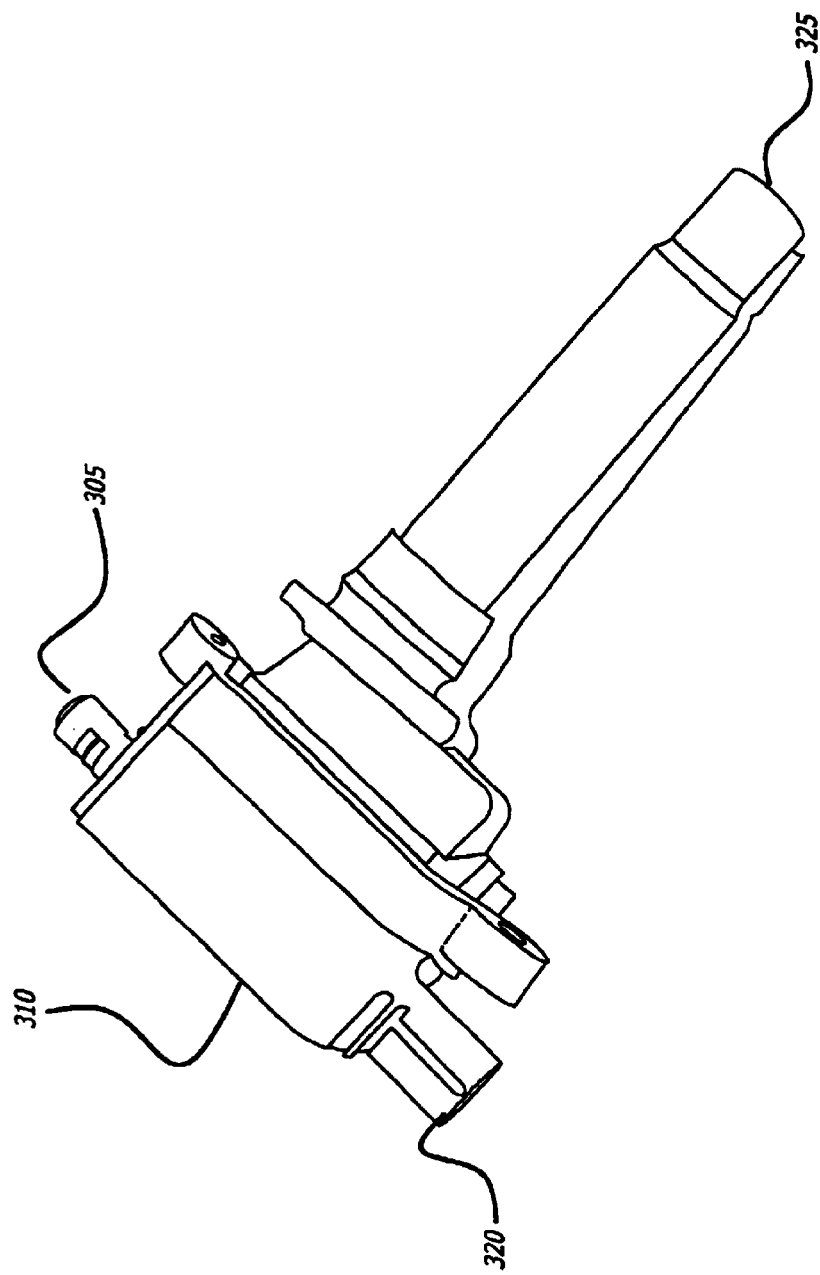
FIG. 2 is an illustration of the portions of a hybrid ignition system involved in the steps of a method of one embodiment of the present disclosure.

Referring now to FIG. 2, illustrated is a single coil for a hybrid ignition system in accordance with one embodiment of the present disclosure. In this illustration the coil 310 includes primary connector 305, accessible spark plug wire 320 and a second spark plug wire (inaccessible) 325. A hybrid ignition system for a four-cylinder engine would include two of such coils.

Where a six-, eight-, ten-, twelve- or sixteen-cylinder engine is involved, a bit of additional preparatory work is required when compared to a four-cylinder engine. In all but the four-cylinder engine, an initial step in this inventive method is determining the firing order of the cylinders as well as the position of the first cylinder that fires. If a SNAP ON SCANNER diagnostic device or MODIS modular diagnostic information system device complete with vehicle databases is available, this procedure can quickly be performed. If such a device is not available, and the firing order for an eight-cylinder engine is, for example 18436572, the last four digits should be placed under the first four, and the firing order could be represented as follows:

1843

6572

In this case, the companion to cylinder 1 is 6. The companion to cylinder 8 is cylinder 5, the companion to cylinder 4 is cylinder 7, and the companion to cylinder 3 is cylinder 2. It should be noted that the companion cylinders could also be physically located by tracing the wires from each coil pack. From this point forward, the process is the same for four-, six-, eight-, ten-, twelve- or sixteen-cylinder engines. The above steps involving determining of firing order of all cylinders as well as the position of the first cylinder are not required for a four-cylinder engine.

In the method of the present disclosure, for a four-, six-, eight-, ten-, twelve- or sixteen-cylinder engine, the primary connector 305 of coil 310 is disconnected from the engine.

Many vehicles have normal operating idle speeds at 1000 rpm or less. Although the method of the present disclosure may be suitable when a vehicle's operating idle speed is between its normal operating idle speed and an idle speed of 1500 rpm or even higher, the method is suitable for many vehicles at a fast idle speed of generally about 1500 rpm. A decline in misfiring or roughness is more readily detected for almost any vehicle when a primary connector for a coil is disconnected. It should be noted that fast idle speeds vary by vehicle since vehicles have different normal operating idle speeds. A skilled technician should be able to determine a fast idle speed for a vehicle. If the engine controls do not automatically bring the idle speed of the vehicle to about 1500 rpm, a shim could be inserted into engine linkage to adjust or increase idle speed to obtain about 1500 rpm. Usually, this linkage goes to a throttle body injector that links to the accelerator pedal. In a sense, insertion of a shim into this linkage is the equivalent of adjusting the weight on an accelerator pedal. The type of shim used might be a cuticle stick, a fingernail file or any other thin piece of material or device that can be used to adjust the fuel flow to the engine, e.g., a SNAP-ON throttle depressor tool (Part B240B).

Engine problems originating in the ignition system are faults often characterized by misfiring or roughness. Misfiring occurs when the spark does not result in proper combustion within the cylinder, resulting in an abnormal firing line voltage for the cylinder. Specifically, it is generally caused by lower than normal cylinder contribution to total engine power output by one (or more) cylinders. The physical manifestation of a low cylinder contribution is generally engine movement (shake) which translates to roughness. Visual signs of roughness might include engine movement in periodic fashion such that the tip of radio antenna does not remain fixed. Audible signs of roughness might include periodic pauses in flow of exhaust gasses (putting). Tactile signs of engine roughness might include shaking that is sensed when a technician places a hand in the engine, the body of a vehicle, or any solid vehicle part or component. Roughness may also result in a higher oxygen level due to unburned fuel mixture.

Because misfiring or roughness is associated with common faults of an ignition system, the present method takes advantage of these symptoms—or more specifically, the lack thereof—to identify a faulty cylinder in a distributorless or hybrid ignition system.

The vehicle's idle speed was adjusted to about 1500 rpm because if the idle speed is too low, a vehicle may tend to experience misfiring or roughness, notwithstanding engine problems. Accordingly, a decline in misfiring or roughness is more difficult to detect when the primary connector 305 is disconnected. In accordance with the present disclosure, the vehicle's idle speed should be raised to about 1500 rpm so that misfiring or roughness is more readily detected. Raising the idle speed to this fast idle speed makes the method disclosed herein suitable for most of today's vehicles.

A common fault in DIS and hybrid ignition systems is a fouled or shorted spark plug. Spark plugs, threaded into the cylinder of an internal combustion engine, provide a pair of electrodes. An electrical discharge is passed between these electrodes to ignite the mixture of fuel and air. Spark plugs may become fouled when scaly sedimentary deposits form on the plug, often as a result of burned particles due to this ignition process. Short circuits of spark plug gaps may occur when an excessive current flows across the electrodes of the plug, thereby causing damage to the plugs, usually from severe overloading.

Another common fault of DIS or hybrid ignition systems is the arcing of high voltage to ground external to the plug. Yet another example of a common fault is when the plug wire becomes connected to ground, usually as a result of abrasion or chafing of the plug wires. Still another example of a common fault is when a spark plug becomes disconnected so that no arc or spark occurs.

A break in the high voltage connection of the to the spark plug usually in plug wire might also cause a fault. An open or short internal coil might also cause engine faults. All of the above faults can cause periodic or intermittent misfiring, which results in roughness at normal idle. An open coil would result in smooth idle, but substantial power loss.

Accordingly, when misfiring or roughness declines following disconnection of a primary connector for a coil, the problem cylinder pair has generally been identified. If the misfiring or roughness does not decline when the primary connector for the first coil is pulled, the first connector is reconnected. Then, the primary connector for the remaining second coil of the ignition system of a four-cylinder engine is disconnected in order to determine whether the second cylinder pair includes one or more faulty cylinders. The order of coil disconnection is of little consequence as long as two primary connectors are not pulled at the same time.

If a particular primary connector for a coil is disconnected, and the idle speed is lower than about 1500 rpm or other fast idle, a shim may be inserted by the technician into the linkage of the engine to adjust the idle speed to about 1500 rpm. Adjustment of a vehicle's accelerator linkage is a common activity performed by mechanics charged with auto repair or diagnostics. One example is California smog tests, where testing is done at idle and 2500 rpm (in neutral). A speed of 2500 rpm may be obtained by "shimming", or inserting a pedal jack into the linkage. As a predecessor to cruise control, older vehicles were equipped with a hand throttle where speed was adjusted by overriding the foot accelerator pedal. Every engine in every car will employ a different mechanical configuration for linkage. In very late model cars, some manufacturers use electronic throttle control, where external linkage may not be present. In these cases, for a distributorless or hybrid ignition system, a foot throttle depressor may be used. This depressor is a common item in repair shops. One example of a foot throttle depressor is a SNAP-ON foot throttle depressor (Part #B240B).

Once the car is at a fast idle speed, the technician should determine whether misfiring or roughness of the engine declines. This determination can be made without equipment. If misfiring or roughness of the engine declines when a primary connector 310 is disconnected, the problem cylinder pair has been located. Alternatively, other devices such as vibration sensors could be used to make this determination.

The same process above applies to a distributorless ignition system, i.e., consecutively disconnecting the primary connector from each coil until misfiring or roughness declines. More than one primary connector should not be disconnected at the same time, regardless of the type of ignition system.

It should be noted that if no change in misfiring or roughness occurs upon disconnection of the primary connector for each coil, the problem may be mechanical. For example, the problem might be a fuel or compression problem involving a gasket, ring, port injector, piston/ring or the like.

Once the faulty cylinder pair has been identified, the technician would then need to narrow the fault to a particular cylinder so that the repair process can begin. The technician identifies a faulty cylinder by measuring the firing line voltage on each accessible spark plug wire. One example of a suitable device for measuring firing line voltage in accordance with the present disclosure is a SNAP ON VANTAGE MT2400 firing line voltage measurement device. The SNAP ON VANTAGE MT2400 is equipped with a SNAP ON KV module, SNAP ON KV clip and SNAP ON RPM clamp. Another example of such a device is a SNAP ON DIS TESTER MT2700 firing line voltage meter. These SNAP ON products are commercially available from Snap-On Technologies, Inc. Yet another example of a device that can measure the firing line voltage is a MODIS modular diagnostic information system.

Figure 3:
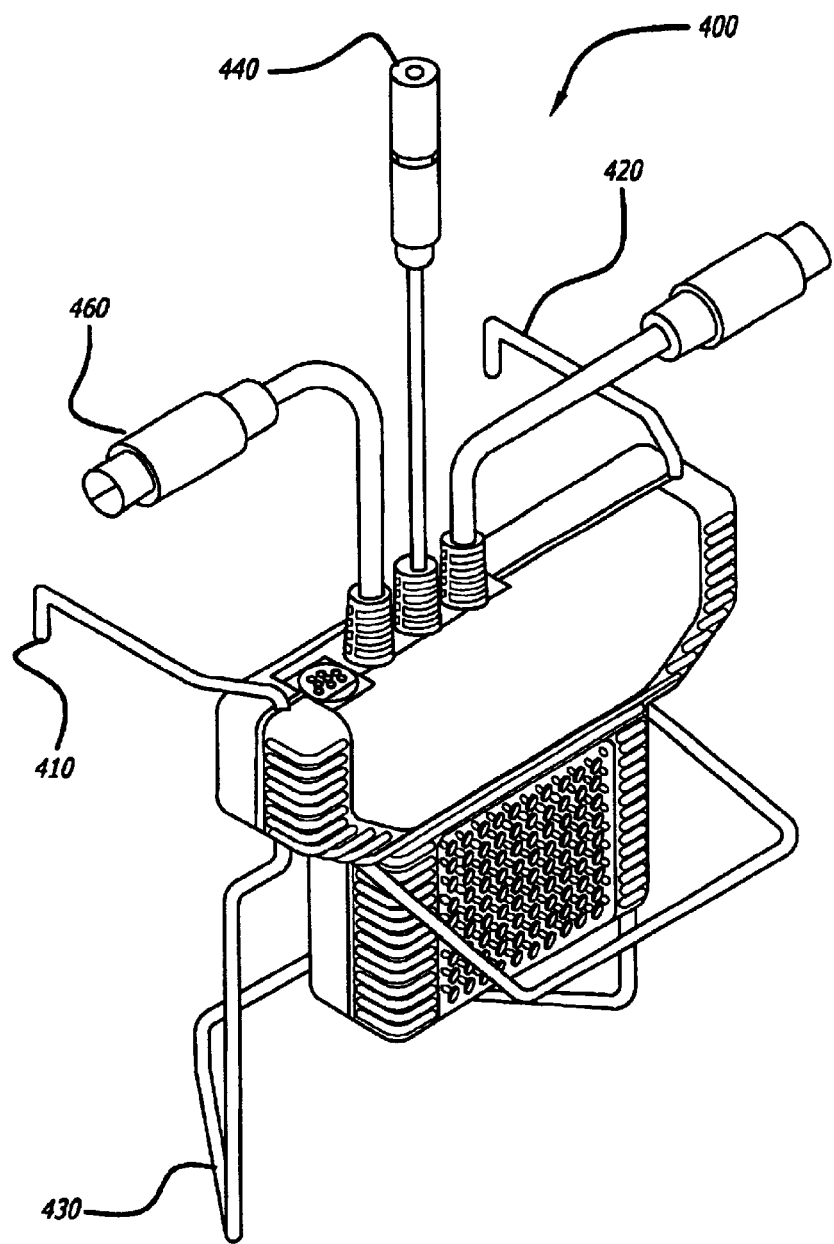
FIG. 3 is an illustration of a SNAP ON KV module adapted for use with a SNAP ON MT2400 meter, SNAP ON KV clip and SNAP ON RPM clamp.

Referring now to FIG. 3, illustrated is a SNAP ON kV module used in conjunction with the SNAP ON VANTAGE MT 2400 voltage measurement device to measure a spark plug's firing line voltage. First, the kV module must be attached to the VANTAGE MT2400, and the leads should be connected to the ignition system. (The VANTAGE MT2400 voltage measurement device will be described in further detail in FIG. 4). These steps are performed by laying the two open clips 410, 420 of the kV Module 400. The bottom clip 430 is then pulled to the front of the unit until securely fastened to the bottom of the VANTAGE MT 2400 voltage measurement device. Connector 440 is then attached to the VANTAGE MT2400 meter's channel 1 input. Connector 460 on kV Module 400 is then attached to the channel 3/channel 4 input of the MT2400 Vantage. The SNAP ON MT2400 VANTAGE test lead is connected from the meter's COM input to a known ground.

A clip on wire adapter and cable should be attached to the kV Module's sampling cable. For coil-over-plug assemblies, such as those found in hybrid ignition systems, capacitive adapters may be used. The clip on wire adapter should be attached to the ignition coil. An additional attachment may be required where ignition systems with distributors are used: the coil in cap adapter should be attached to the distributor cap. Specific cylinders are tested by attaching the RPM pickup to the cylinder's secondary cable if available. The kV Module provides an efficient, simple way of measuring and focusing on the firing line segment of an ignition waveform. The reference manual for the SNAP ON kV module is hereby incorporated by reference in its entirety.

Figure 4A:
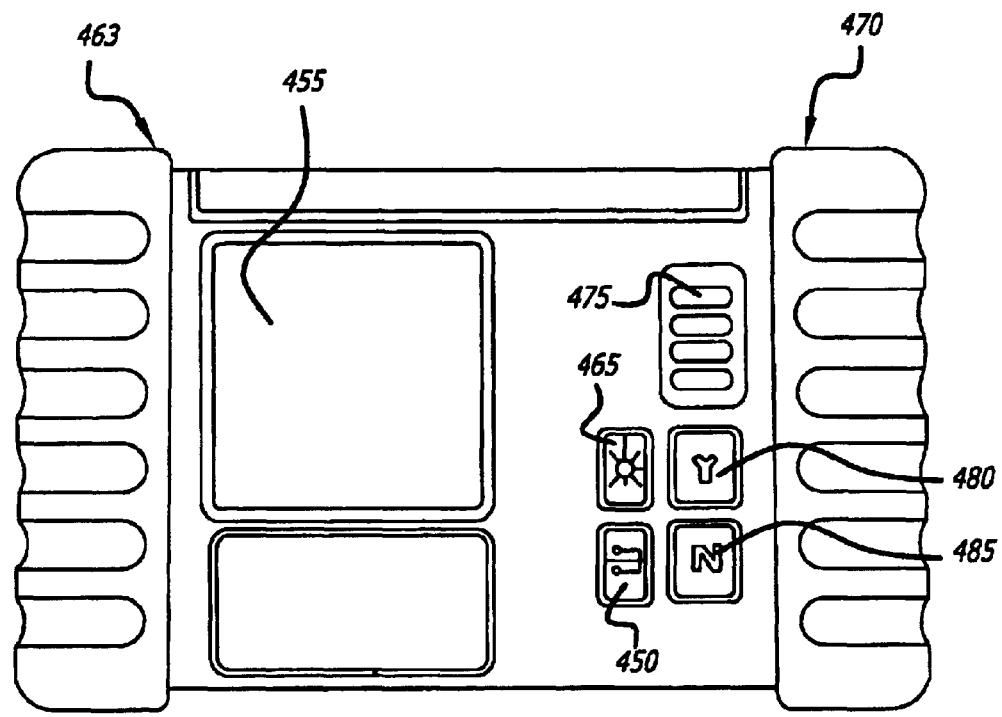
FIG. 4A is a front view of a SNAP ON VANTAGE MT 2400 voltage measurement device.

Referring now to FIG. 4A, illustrated is a front view of a SNAP ON VANTAGE MT 2400 voltage measurement device. As shown, the device includes a power button 450, a graphic LCD display 455, a left handgrip 463 which includes an access cover for the fuse and memory card, a display backlight button 465, a right handgrip 470 which includes an access cover for batteries, a thumbwheel 475 that assists with cursor movement and menu navigation, a "yes" button 480 for selecting menu items and a "no" button 485 for deselecting menu items.

Figure 4B:
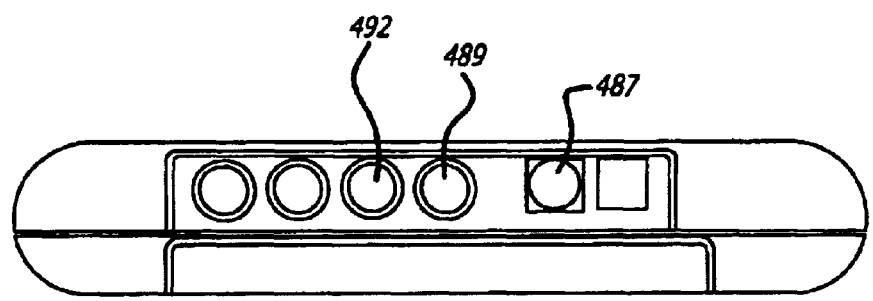
FIG. 4B is a top view of a SNAP ON VANTAGE MT 2400 voltage measurement device.

Referring now to FIG. 4B, illustrated is a top view of the SNAP ON VANTAGE MT 2400 voltage measurement device. As illustrated, the SNAP ON VANTAGE MT 2400 includes a kV Module channel 3/channel 4 input 487, a channel 1 input 489, and a COM input 492 for connection to a known ground. As noted hereinabove, these connections are used in conjunction with the kV module to measure firing line voltage. The reference manual for the SNAP ON VANTAGE MT2400 is hereby incorporated by reference in its entirety.

Figure 5:
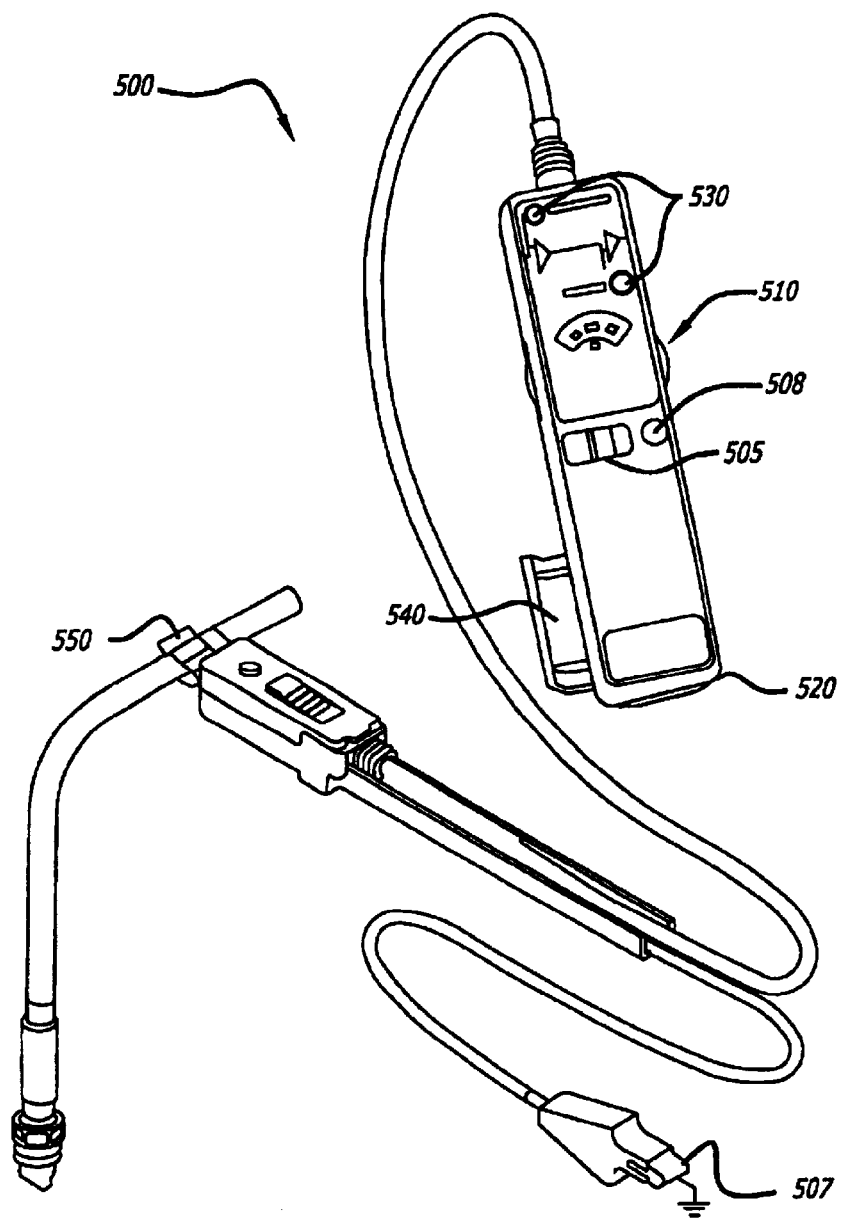
FIG. 5 is an illustration of a SNAP ON DIS TESTER MT2700 meter.

Referring now to FIG. 5, illustrated is a SNAP ON MT2700 DIS TESTER voltage meter 500. Illustrated are power switch 505, power indicator 506, ground connection 507, dial 510, probe 520, and pulse lights 530, battery compartment 540 and probe pickup 550. Power to the meter 500 may be supplied when the power switch 505 is turned on. The ground connection 507 should be connected to a good engine ground. The vehicle engine should have been started and allowed to idle. (It is safest to turn the engine off after primary coil disconnection, and then restarted before testing voltage; however, the process can be performed with the engine running the entire time.) The probe pickup 550 should be positioned around a spark plug wire.

Dial 510 should be turned to a low kV reading until the "conventional" or "inverted" pulse light 530 glows constantly or flashes steadily. The dial 510, or kV setting should then be increased until the pulse light 530 is off. The kV setting should then be increased only until the pulse light 530 is turned on or flashes unevenly. The approximate firing voltage may then be read on dial 510. The reference manual for the SNAP ON DIS TESTER MT2700 is hereby incorporated by reference in its entirety.

In the case of a distributorless ignition system, two spark plug wires are generally accessible. Therefore, the firing line voltage on both spark plug wires should be measured. The measurements may be taken with either of the firing line voltage measurement devices described above. The spark plug wire with abnormal voltage (higher or lower) is at fault.

In the case of a hybrid ignition system, only one spark plug wire is generally accessible. The firing line voltage may be measured from this accessible spark plug wire. If the voltage pattern, which may be represented by a waveform, on the single accessible spark plug wire is normal, the faulty cylinder is the coil over plug cylinder. For hybrid systems, if the firing line voltage is abnormal, the fault is with the companion cylinder.

Generally, the firing line voltage, averaged statistically, for today's cylinders is around 8 kV to 9 kV. On older vehicles, the firing line voltage might be 6 kV to 9 kV. Ignition system problems are often characterized by sharp voltage peaks or sharp voltage drops measured from the accessible spark plug wire. At the upper end of the scale, an ignition problem might be evidenced by a firing line voltage of around 35 kV or higher. At the lower end of the scale, an ignition system problem might be evidenced by a firing line voltage of around 2 kV to 3 kV or lower. The firing line voltage varies with each firing of a spark plug due to factors such as ionization and the amount of compression. However, generally, a drop to an average firing line voltage of 4 kV or a rise to an average of 18 kV would be abnormal, while a range of 7 kV to 12 kV would generally be considered normal. The SNAP ON VANTAGE MT 2400 and MT 2700 DIS TESTER voltage measurement devices include a built-in averaging device for taking a measurement. The firing line measurement can generally be taken over the course of a few seconds.

Some conventional diagnostic systems might provide a higher degree of certainty as to the origin of an engine problem. These conventional systems might also be capable of determining the portion of the ignition system that is the origin of the problem. Therefore, prior to proceeding to repair, some technicians might wish to further confirm the problem as the ignition system and/or narrow the origin to a particular segment of the ignition system.

The method and system has been described with reference to certain exemplary embodiments. However, it will be readily apparent to those skilled in the art that it is possible to embody the method and system in forms other than these embodiments. This may be done without departing from the spirit of the disclosure. The embodiments are merely illustrative and should not be considered restrictive in any way. The scope of the method and system are given by the appended claims, rather than the preceding description, and all variations and equivalents that fall within the range of the claims are intended to be embraced.

What is claimed is:

1. A method for diagnosis of ignition system faults in an internal combustion engine of a type that includes an ignition system that includes at least two ignition coils, each of the ignition coils having a primary connector that connects to a cylinder pair, the method comprising the steps of:
   consecutively disconnecting and reconnecting the primary connector for each coil that connects to a cylinder pair;
   when a single primary connector is disconnected, determining whether misfiring or roughness declines, thereby identifying a faulty cylinder pair;
   for each cylinder of the identified faulty cylinder pair, measuring a firing line voltage for each accessible spark plug wire connected to the identified faulty cylinder pair;

identifying a faulty cylinder based on a measured abnormal firing line voltage;

prior to the step of determining whether the misfiring or roughness declines when the primary connector is disconnected, determining whether idle speed of the vehicle is lower than fast idle speed before one of the primary connectors is disconnected; and if the idle speed is lower than fast idle speed, increasing the idle speed of the vehicle such that the idle speed of the vehicle is at fast idle speed.

2. The method as recited in claim 1 wherein the engine is a four-cylinder engine.

3. The method as recited in claim 1 further comprising the steps of:

prior to the disconnecting step, determining a firing order for the cylinders of the engine and the position of the first firing cylinder; and identifying cylinder pairs based on the connection of two cylinders to the same primary connector.

4. The method as recited in claim 1, wherein the engine has a number of cylinders that is selected from the group consisting of four, six, eight, ten, twelve and sixteen.

5. The method as recited in claim 1, wherein the step of identifying a faulty cylinder based on a measured abnormal firing line voltage includes the step of:

displaying the abnormal firing line voltage as part of a waveform.

6. The method as recited in claim 1, wherein the restoring step comprises inserting a shim into linkage that controls fuel flow.

7. The method as recited in claim 1, wherein the ignition coil is configured as a coil over plug assembly having a single accessible spark plug wire.

8. The method as recited in claim 1, wherein each ignition coil of the ignition system includes two outputs, each of said outputs being connected to spark plugs for two cylinders.

* * * * *